(12) United States Patent
Pallister et al.

(10) Patent No.: US 11,907,628 B2
(45) Date of Patent: Feb. 20, 2024

(54) MESSAGE SIGNOFFS

(71) Applicant: Graphcore Limited, Bristol (GB)

(72) Inventors: James Pallister, Bristol (GB); William Keen, Bristol (GB); Richard Porter, Bristol (GB)

(73) Assignee: GRAPHCORE LIMITED, Bristol (GB)

( * ) Notice: Subject to any disclaimer, the term of this patent is extended or adjusted under 35 U.S.C. 154(b) by 340 days.

(21) Appl. No.: 17/326,991

(22) Filed: May 21, 2021

(65) Prior Publication Data

US 2022/0269844 A1 Aug. 25, 2022

(30) Foreign Application Priority Data

Feb. 25, 2021 (GB) .................................... 2102693

(51) Int. Cl.
*G06F 30/30* (2020.01)
*G06F 30/33* (2020.01)
*G06F 30/31* (2020.01)

(52) U.S. Cl.
CPC .............. *G06F 30/33* (2020.01); *G06F 30/31* (2020.01)

(58) Field of Classification Search
CPC .................................. G06F 30/33; G06F 30/31
See application file for complete search history.

(56) References Cited

U.S. PATENT DOCUMENTS

| 8,826,202 B1* | 9/2014 | Goel | G06F 30/3323 |
| | | | 716/136 |
| 2005/0066263 A1* | 3/2005 | Baugher | G06N 5/025 |
| | | | 715/255 |
| 2014/0258954 A1* | 9/2014 | De | G06F 30/3323 |
| | | | 716/113 |

\* cited by examiner

*Primary Examiner* — Jack Chiang
*Assistant Examiner* — Brandon Bowers
(74) *Attorney, Agent, or Firm* — HAYNES AND BOONE, LLP

(57) ABSTRACT

A computer design verification system comprising a parsing module configured to receive output messages from a computer design testing tool and to compose from the output messages formatted objects comprising a set of fields having field descriptors and test values; a signoff module holding a plurality of signoff objects, each comprising a plurality of fields having a field descriptor, at least some fields populated with a signoff expression, each signoff object associated with a severity level indicative of the severity of a condition represented by the signoff object. The signoff module is configured compare at least one test value in the formatted objects received from the parsing module with at least one signoff expression in the signoff objects to determine if a signoff object matches the formatted object, and in the case of a match, associating the severity level of the signoff object with the formatted object.

19 Claims, 10 Drawing Sheets

| 200 | 202 | 204 | 206 | 208 | 210 |
|---|---|---|---|---|---|
| Severity | Ident | Subident | File | Line | Message |
| | | | | | |

FIG. 2A

| 214 | 216 | 218 | 220 | | | 224 |
|---|---|---|---|---|---|---|
| Severity | Ident | Subident | Msg | ... | ... | ... |

```
<signoff gc:owner="ownername">
    <description>Container </description>
    <severity>error</severity>
    <match><file>file_name</file></match>
    <signoff gc:owner="owner">
        <description>These two are ok</description>
        <severity>info</severity>
        <match><text>message_text_1</text></match>
        <match><text>message_text_2</text></match>
    </signoff>
</signoff>
```

FIG. 6C

| 802 | 804 | 806 | 808 | 810 | 812 | 814 | 816 |
|---|---|---|---|---|---|---|---|
| Signoff | Orig. Severity | Severity | Ident | Subident | File | Line | Message |
| | | | | | | | |

| 822 | 824 | 826 | 828 | 830 | 832 | 834 | 836 | 838 | 840 |
|---|---|---|---|---|---|---|---|---|---|
| Platform | Ident | Subident | Parent | Owner | Severity | Description | Match | Run Arg | Source |
| | | | | | | | | | |

MESSAGE SIGNOFFS

CROSS-REFERENCE TO RELATED APPLICATIONS

The present application claims priority to United Kingdom Patent Application No. 2102693.5, filed on Feb. 25, 2021, the disclosure of which is hereby incorporated herein by reference in its entirety.

TECHNICAL FIELD

The present disclosure relates to testing and verification of computer components such as integrated circuits.

BACKGROUND

The process of manufacturing computer components such as integrated circuits, starts with an initial design phase.

When creating an integrated circuit design, the aim is to test the design as comprehensively as possible before it is "taped out", which is the process of laying down the physical manufacturing template to make the IC. A variety of electronic design automation (EDA) tools exist to test and verify a design. Many of these provide tool outputs as a standard output (stdout) or standard error (stderr) stream. Tool outputs vary between tools, but they typically take the form of a string of raw text messages. To verify a design, the output of the testing tools must be reviewed. The stdout and stderr streams may be reviewed manually. However, the format of the data output by the standard streams is unstructured, making it difficult to review or query in any systematic way.

SUMMARY

The present disclosure provides a method of automatically handling messages from one or more testing tools, comprising a parsing step to create and store structured queryable messages from raw text input, and a signoff step, which automatically reviews and modifies messages according to a defined set of rules.

A first aspect disclosed herein provides a computer design verification system comprising:
- a parsing module configured to receive output messages from a testing tool arranged to test a computer component and to compose from the output messages formatted objects, each formatted object comprising a set of fields, each field having a field descriptor and at least some of the fields holding test values;
- a signoff module holding a plurality of signoff objects, each comprising a plurality of fields, each field having a field descriptor and at least some of the fields populated with a signoff expression, each signoff object associated with a severity level indicative of the severity of a condition represented by the signoff object,
- wherein the signoff module is configured to receive the formatted objects from the parsing module and to compare the test values in each formatted object to compare at least one test value in the formatted objects with at least one signoff expression in the signoff objects to determine if a signoff object matches the formatted object, and in the case that it is determined that the a signoff object matches the formatted object, associating the severity level of the signoff object with the formatted object.

The signoff object may comprise an identity field which identifies the condition represented by the signoff object, wherein the signoff module is configured to compare the identity field with an identity field of the formatted object to determine whether or not there is a match.

One or more of the signoff expressions may specify one or more parameter of the signoff condition. The signoff module may be configured to compare the one or more signoff expression with one or more corresponding test values in fields of the formatted object to determine whether the one or more parameter of the signoff condition is matched.

At least some of the signoff objects may not comprise an identifier field.

The system may comprise a signoff configuration file which stores a set of signoff objects associated with at least one of a particular design of computer component to be verified and a particular testing tool.

The signoff module may comprise a generic identity indication associated with a default severity level, wherein the signoff module is configured to apply the default severity level to formatted objects having an identity in their identity field which match the generic identity.

The signoff module may comprise a nested signoff storage structure having an outer layer of signoff expressions shared by multiple signoff objects, and an inner layer having signoff expressions of those multiple signoff objects which are not shared.

The signoff module may comprise a plurality of signoff configuration files, each signoff configuration file associated with a respective particular testing tool.

The signoff module may be configured to receive an identifier of the testing tool and to disable predetermined test outputs from the testing tool.

The parsing module may be configured to generate test data objects for storage, each test data object having the format of a corresponding formatted object derived from the test output.

The parsing module may be configured to apply the altered severity level received from the signoff module to the test data object prior to storing the test data object in a data structure.

The system may comprise one or more testing tool configured to test the computer component and to generate the test outputs for supply to the parsing module.

A second aspect disclosed herein provides a method of verifying a computer design, comprising the steps of:
- receiving test outputs from one or more testing tool configured to test a computer component;
- generating from the test outputs a set of formatted objects, each formatted object comprising a set of fields, each field associated with a field descriptor and holding test values;
- supplying the formatted objects to a signoff module holding a plurality of signoff objects, each signoff object comprising a plurality of fields, each field having a field descriptor and holding a signoff expression;
- comparing the test values in the fields of the formatted object with the signoff expressions in the signoff objects to detect if there is a match, and
- in the case of a match associating a severity level of the matched signoff object with the formatted object.

The method may comprise generating a data storage object from the test outputs, the data storage object having a format corresponding to the format of the formatted object, and storing the test data object in a data structure.

The method may comprise storing the test data object with the altered severity level applied by the signoff module.

The formatted object may be associated with a severity indicator derived from the test output, the method comprising altering the severity indicator by applying the severity level of the matched signoff object.

A third aspect disclosed herein provides a computer design verification system comprising:

- a parsing module configured to receive test outputs from a plurality of testing tools and to generate from the test data outputs, test data objects, each test data object comprising a plurality of fields, each field having a field descriptor and a test value derived from the test outputs; and
- storing the test data objects in a test data structure having a corresponding set of fields, each field having a field descriptor corresponding to the field descriptor of the test data object and configured to receive the test value associated with that field.

The system may comprise a signoff module holding a plurality of signoff objects, each comprising a plurality of fields, each field having a field descriptor and at least some of the fields populated with a signoff expression, each signoff object associated with a severity level indicative of the severity of a condition represented by the signoff object, wherein the parsing module is configured to compose from the test outputs formatted objects, each formatted object comprising a set of fields, each field having a field descriptor and at least some of the fields holding test values; and wherein the signoff module is configured to receive the test data objects from the parsing module and to compare at least one test value in the test data objects with at least one signoff expression in the signoff objects to determine if a signoff object matches the test data object, and in the case that it is determined that a signoff object matches the test data object, associating the severity level of the signoff object with the test data object.

The signoff module may comprise a nested signoff storage structure having an outer layer of signoff expressions shared by multiple signoff objects, and an inner layer having signoff expressions of those multiple signoff objects which are not shared.

The parsing module may be configured to apply the altered severity level received from the signoff module to the test data object prior to storing the test data object in a data structure.

For a better understanding of the present disclosure and to show how the same may be carried into effect, reference will now be made by way of example only to the accompanying drawings.

BRIEF DESCRIPTION OF FIGURES

FIG. 2A shows an example data structure for parsed messages.

FIG. 2B shows the components of an example message object.

FIG. 3 shows an example portion of a message database.

FIG. 6C shows an example of a nested signoff.

FIG. 8A shows an example data structure for a signed off messages table displayed in a signoff report.

FIG. 8B shows an example data structure for a defined signoffs table of a signoff report.

DETAILED DESCRIPTION

Figure 1:
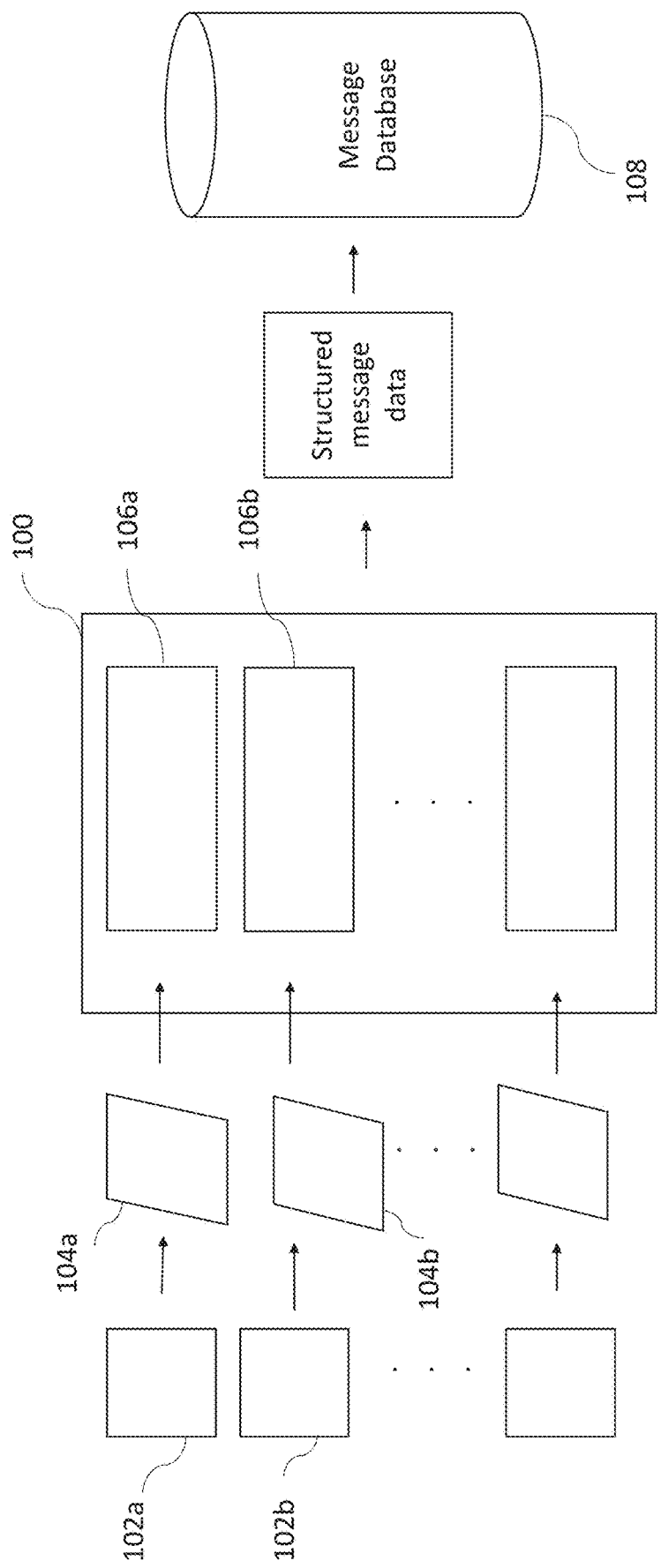
FIG. 1 is a schematic block diagram showing a message parser for a variety of testing tools.

The present disclosure relates to a computer design verification system which enables testing computer components to be systematically verified in a manner which reduces manual effort and ensures that each component can be tested according to its specific needs.

The system and method described herein address certain particular challenges. An improved reporting data structure is established. As described further herein, this addresses the challenge which arises as a result of the reporting format for existing testing tools. Current tools may provide an output log organised by time, each item on the log showing information relating to the message which was logged at that time. For example, each item may have a log time, a severity (described in more detail later), text denoting the nature of the message and further descriptors. Message severities, ranked from most severe to least severe, may include 'fatal', 'error', 'warning', 'note', 'info', and 'debug'. However, this information is not generally structured, such that each item comprises a text string which contains the log time, severity, text and other descriptors of the message without identifying them as such. Although the output logs may be searched, the current searching uses regular expressions (regex), which define a search string, on the messages in free text format, which does not make a distinction between different pieces of information within each logged item. This makes it difficult to identify and filter messages according to desired search criteria, such as severity.

The verification system described herein addresses these challenges by providing a query-able data structure. The query-able data structure provided by the present system also addresses another common challenge when testing computer components. As components become more complex, different testing tools may be needed for optimising the test of particular components. Currently, each testing tool provides its own kind of output log. There is no standard way of reporting from the tools, and therefore, no standard format for querying the outputs of each tool.

It has in the past been necessary to review the outputs of each tool separately, noting that the reporting structures and, formats and identifiers may be different for each tool.

The data structure provided herein enables messages from different tools to be parsed into a common database format for ease of searching and analysis.

Note that design errors are not solely identified by EDA tools. Functional errors in the design may be 'user-written', i.e. written by a verification engineer of the company producing the hardware component. Since the producer of the hardware has control over the scope and messages of these error checks, errors raised by user-written code is typically indicative of real errors. However, EDA tool errors can raise potential errors that may or may not represent 'real' functional design issues that will impact the end user. A verification engineer typically reviews these error messages to determine how they should be handled. Tools and techniques currently exist to 'triage' errors from EDA tools, such as raising tickets in a project management system corresponding to the errors output by the tools.

An aspect of the present disclosure introduces the concept of "signoffs". Currently, the term "signoff" is used to denote a process by which a verification engineer may determine that a computer component has been adequately tested. The component is "signed off". In the sign-off process, an engineer needs to determine which errors have been identified and whether or not they have been fixed. This can be an extremely time consuming and difficult (sometimes impossible) process using the log-based outputs from current testing tools, particularly when multiple tools are involved. It can become virtually impossible to track which errors were identified, how severe they were and whether or not they have been fixed.

Further, it becomes a matter of skill and personal judgement to determine whether or not an error which has not been fixed may safely remain in the computer component. Note that this is the case in particular for errors produced by EDA tools, rather than functional error testing based on code written within the company producing the hardware component. There are many situations where messages are logged as errors during testing which, in fact, do not cause problems when the computer component is made and used in practice. Conversely, there are certain issues which arise in the computer component where it is being tested which may not be flagged with the necessary severity, or at all.

The term "signoff" used herein does not denote this time consuming, manual sign-off process. Instead, the term is used herein to denote a rule applied to a particular message matching a predetermined condition to enable engineers to process potential design errors in a systematic way. The signoff mechanism described herein may be applied to any messages, whether user-written or produced by EDA tools. However, as described above, a sign-off mechanism is useful for processing potential errors or issues output by EDA tools, and is not typically needed for user-written testing, for which errors are under the control of the hardware producer. Therefore, the discussion of message signoffs herein focuses on their application to EDA tool messages.

For example, signoffs can be used to automatically determine two important categories of warning that may have arisen from one or more tools during testing. According to the first category, the warning is identified as one which is important to care about and fix. The second category are warnings which the designers or testing engineers have determined are not significant, and may be 'signed off' without further fixing. In this example, the rule applied by sign-offs is the changing of severity of the warning in a message database according to whichever of the above categories it falls into, where warnings in the first category may be upgraded to 'error' and warnings of the second category may be downgraded to 'info'. By using signoffs to divide warnings into these two categories, it becomes possible to reliably verify that a component has passed testing. Either a warning will have been signed off, or it will have been fixed when the products goes to tape-out.

Furthermore, signoffs as described herein enable analysing results of verification that can be tracked, reviewed, and controlled as described further herein.

Note that, while the following describes signoffs in which a rule applies a change to the severity of a message, depending on a set of match conditions, in principle signoffs may be defined to update other attributes of a given message output by a testing tool, according to requirements at testing.

Further description of these features is given below.

During verification of a computer component, such as an integrated circuit design, the engineer may wish to find and review particular messages that are raised during a particular test or set of tests carried out by a testing tool. One example of criteria that may be used to search for and review messages is severity. Message severities, ranked from most severe to least severe, may include 'fatal', 'error', 'warning', 'note', 'info', and 'debug'. A single 'fatal' or 'error' message in a test may cause the test to fail. 'Warnings' do not individually indicate a failed test, but a number of warning messages above a set threshold, for example 1000 messages, can indicate a failed test. In existing output logs, the engineer may wish to filter the output from the testing tool by severity, for example, by limiting the messages only to 'error' messages. As mentioned, this may be done with a simple text search using regular expressions. However, this may return a number of irrelevant matches as a search on the full output text will match on any message with 'error' in the text, not just messages with severity 'error'.

To convert unstructured output of a verification or a testing tool to a queryable data structure, a parser module is used. FIG. 1 shows a parser module 100 which takes in unstructured message text 104a, 104b, etc., from a set of verification tools 102a, 102b, etc., where the form of the message text is specific to each tool. For example, the standard out (stdout) and standard error (stderr) output streams from verification tools may be supplied to the parser module 100. For example, a verification tool may output the message to its stdout stream as follows:

"WARNING [SIOB] xm_supertile/ip/rtl/xm_supertile.sv:
    403 signal index out of bounds-port fp8_opa is only
    four bits wide."

The above is an example of a raw text message produced by a verification tool.

Since each tool 102a, 102b produces messages of different types and formats, the parser module may have a different parser 106a, 106b for each tool in use. Each parser 106a, 106b, etc. takes the unstructured message text from the relevant tool and processes it to extract relevant information and construct a set of data items, each item corresponding to a message and comprising a set of attributes and a value for each attribute. Note that the terms 'attribute' and 'field' may be used synonymously herein to refer to elements within a message in the form of either a message object, or a data item of a message database.

The parser module 100 takes in a 'raw' string of text, which contains the information to be extracted to form a structured data item. The parser 106 for each tool applies rules to the raw messages of that tool in order to extract parts of the text of each message as attribute values for the data item. For example, the parser may split each raw text message based on features of the message string in order to pull out relevant information relating to the severity of the message, the message content, and the message identifier.

The data item constructed by the parser module 100 for each raw message received from the one or more verification tools may be referred to as a message object. FIG. 2B shows an example of the message object 212, with severity 214, message 220, identifier ('ident') 216 and sub-identifier ('subident') 218 attributes. The values of each attribute are populated by text extracted from the raw message string by the parser module 100. The parser 100 may also assign values to one or more optional attributes 224 of the message object 212 based on information in the raw message text, where these depend on the given message and verification tool.

The parser passes the message objects 212 to the message database 108, with each attribute of the message object 212 corresponding to a field in the message database with their respective values being determined by information extracted from the message by the parser.

In the example given above, the individual attributes of the message object may be populated as follows:

Severity: warning
Ident: SIOB
Subident: 1
File: xm_supertile/ip/rtl/xm_supertile,sv
Line:403
Msg: signal index out of bounds—port fp8_opa is only four bits wide.

The parser may define a standard set of attributes for messages. However, the parser module 100 may also be configured to identify when a raw text message comprises additional information that does not correspond with any existing standard attribute, and may create structured messages with additional attributes as required.

Structured messages from the parser module are of a standardised format, the messages comprising a set of data items organised into standard fields and also possibly having additional optional fields. These messages are stored to a message database 108, from which they can be accessed at a later stage. These structured messages may be stored in a format such that the fields are easily queryable and searchable.

FIG. 2A shows an example data format for the message database 108. Each message of the message database 108 may comprise an 'ident' (identifier) field 202, which identifies a category of message in question (for example a message ident 'SIOB' identifies a 'signal index out of bounds' error), 'severity' field 200, as described above, 'file' field 206, which identifies the file to which the message refers, and 'message' or 'text' field 210 which is the human-readable part of the message, typically a short description of the cause of the message. The message may also include, for example, a 'line' field 208 which identifies the line in the file that the message refers to, as well as other optional fields which may be defined for particular information in a given message.

Figure 3:
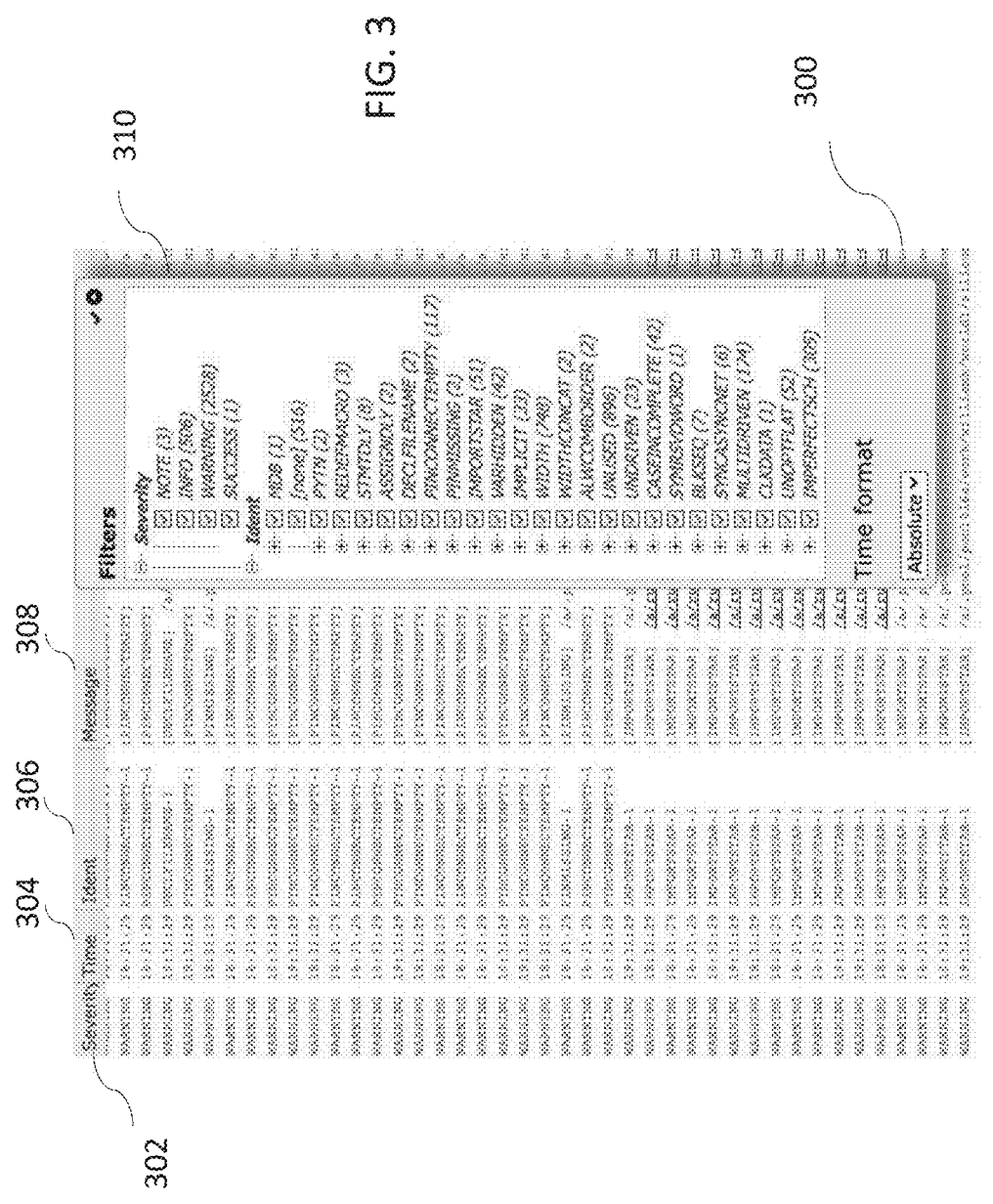

FIG. 3 shows an example of the format of the message database 108 comprising a set of parsed messages of various categories. The database may be displayed in a user interface 300 with columns corresponding to each field, which enables a user to filter messages by severity or other fields for review.

For example, the user interface 300 shown in FIG. 3 may be the user interface of a computer device for accessing the message database 108. The user interface has a severity column 302, a time column 304, an ident column 306, and a message column 308. In FIG. 3, the display has been shown organised by severity indicator, in this case "warning" is displayed. Filters are available as indicated by 310. For example, it is possible to filter on different severity indicators—examples which are shown are note, info, warning and success. It is further possible to filter based on different identifiers, where each identifier indicates a category of the message, such as 'SIOB' for index out of bounds errors.

While the message database and its structured format significantly simplifies reporting of messages found in testing, there still remains the challenge that an engineer has to manually inspect and analyse the data in order to determine whether or not a computer component under test may be passed or not. One issue that may arise is that the category of severity indicator selected by a particular testing tool may be too high or too low for the particular component under test for the event it refers to. This may cause a test to fail, for example, if it is raised as an error. An engineer may be able to determine on inspection that the subject of the given error message would not cause a component failure.

As shown in FIG. 3, test logs may comprise a large number of warning messages. Some of these may represent a real issue to be addressed, whereas others may in reality not cause a failure. For example, an engineer may check the text of a warning message raised in testing and find that the event it relates to is known not to be an issue. The engineer may mark this accordingly by adding a new downgraded severity to the message in the message database Other events may require fixing and retesting.

A potential problem with this manual process is that, for a large number of messages and tests, it becomes intractable to manually check all warning messages. There may be a high degree of repetition of messages to be signed off. One aim of the present system is to provide a method of systematically signing off messages by using rule-based automatic 'signoffs'. A signoff defines a condition against which messages may be matched and rule to set the severity to the level deemed appropriate for messages matching that condition. The condition may be a certain message attribute, so a given signoff is only applied messages whose attribute match the condition defined in the signoff. When a match is found, the severity level of the signoff is applied to the message object selected for that message.

Figure 4:
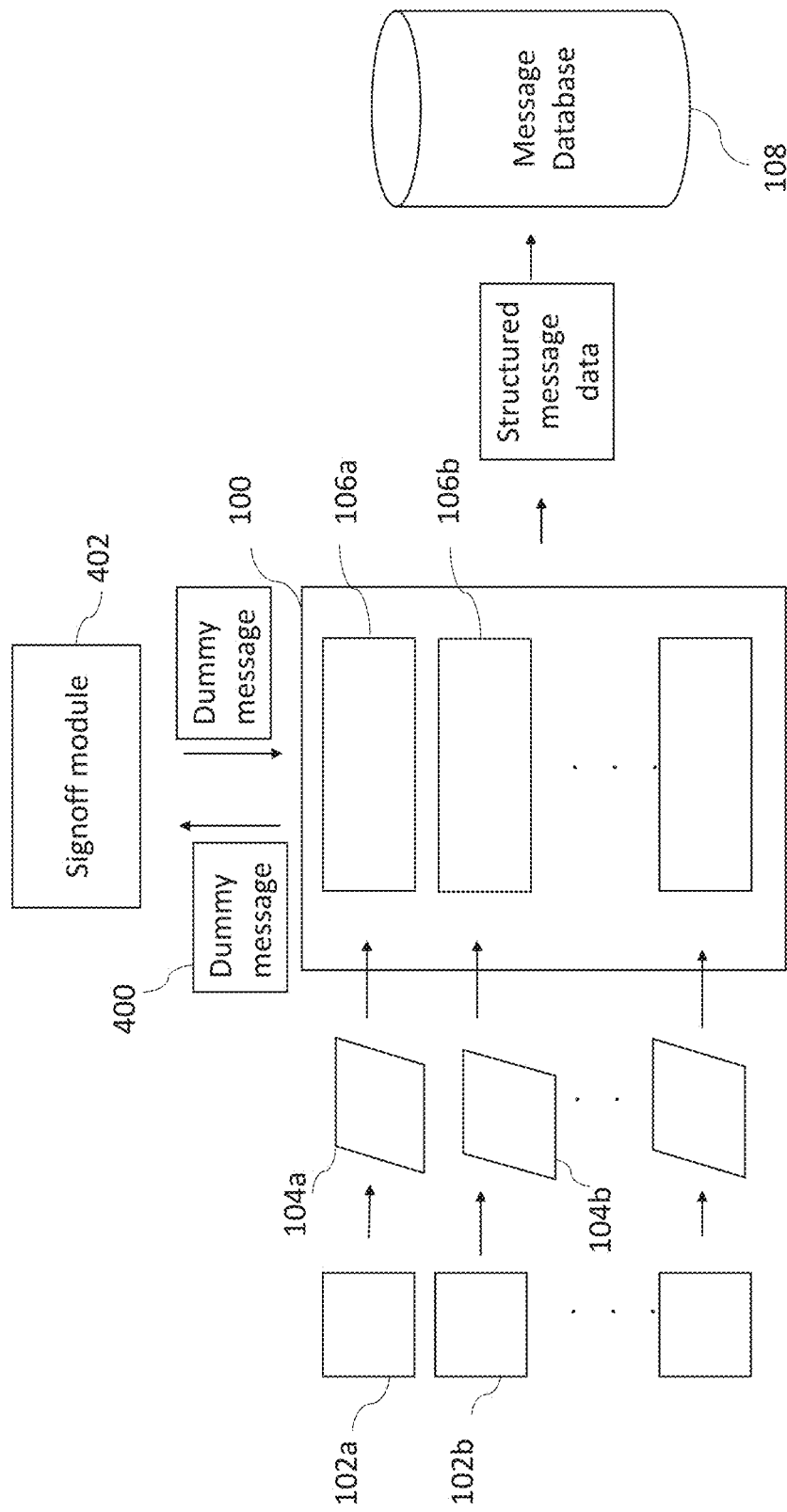
FIG. 4 is a schematic block diagram showing a message parser and signoff program for a variety of testing tools.

FIG. 4 shows an example of a system used to implement a rule-based signoff method, comprising a parser module 100 comprising parsers 106a, 106b, etc. defined for each verification tool, a message database 108 as well as a signoff module 402. A dummy message object 400 is constructed from a real message after it has been processed by the parser module 100 but before it is sent to the message database 108. The dummy message takes the form of the message object described above with reference to FIG. 2A but it is not sent to the database 108 directly. Instead, the dummy message 400 is sent to the signoff module 402 which accesses a pre-defined set of signoffs, each defining a signoff condition to match to the dummy message 400 based on the message attributes, applying a rule to the dummy message 400 to set its severity if the condition is matched.

Signoffs may be defined in a structured signoff file 500, with one file defining all the signoffs applicable for a particular testing platform. The contents of the signoff file 500 is described in more detail later with reference to FIG. 5. The signoff module 402 receives the dummy message 400 with an indication of the relevant testing platform, identifies the relevant signoff file for that tool and matches the dummy message 400 to the set of defined signoffs in that file. If the dummy message 400 matches any of the set of defined signoffs for the given verification tool, the signoff module 402 automatically applies a severity level indicated in the sign-off to the severity indicator attribute of the dummy message.

In one embodiment, the sign-off module 402 checks the severity level in the severity attribute of the dummy message 400 to see whether or not it is a match with the severity level in the sign-off. If it is, no action is taken. If it is not, the severity level in the severity field of the dummy message 400 is altered to correspond to the severity level in the sign-off. In another embodiment, the severity level in the sign-off automatically overrides the severity level in the dummy message. In this case, it is not required to check whether or not the severity levels match. Note that severity levels may be "upgraded" or "downgraded". That is, the severity level applied by the sign-off module may be higher than the severity level in the dummy message, or it may be lower than the severity level in the dummy message. The "signed off" dummy message 400a may then be returned to the parser module 100 to be passed to the message database 108 as a message database object. In the object, the severity indicator has the altered severity level after matching with the relevant sign-off. In the present example, the message sent to the database may have the following attributes:

Severity: "info"
Ident: SIOB
Subident: 1
File: xm_supertile/ip/rtl/xm_supertile.sv
Line: 403
Message: signal index out of bounds—port fp8_opa is only four bits wide.

The signoff files defining the signoffs for different testing tools may be specified in a configuration file by personnel familiar with the testing tool and its message outputs. Note that different engineers may be familiar with different tools, and that inputs may be supplied to the signoff module to specify the tool in question for a given message 400. Signoff files may be organised within the configuration file depending on whether the signoffs in a given file relate to the design, the specific testbench the design is being tested under, or the EDA tool in which the testbench is being run. Some signoffs are design-specific rather than tool-specific.

Figure 5:
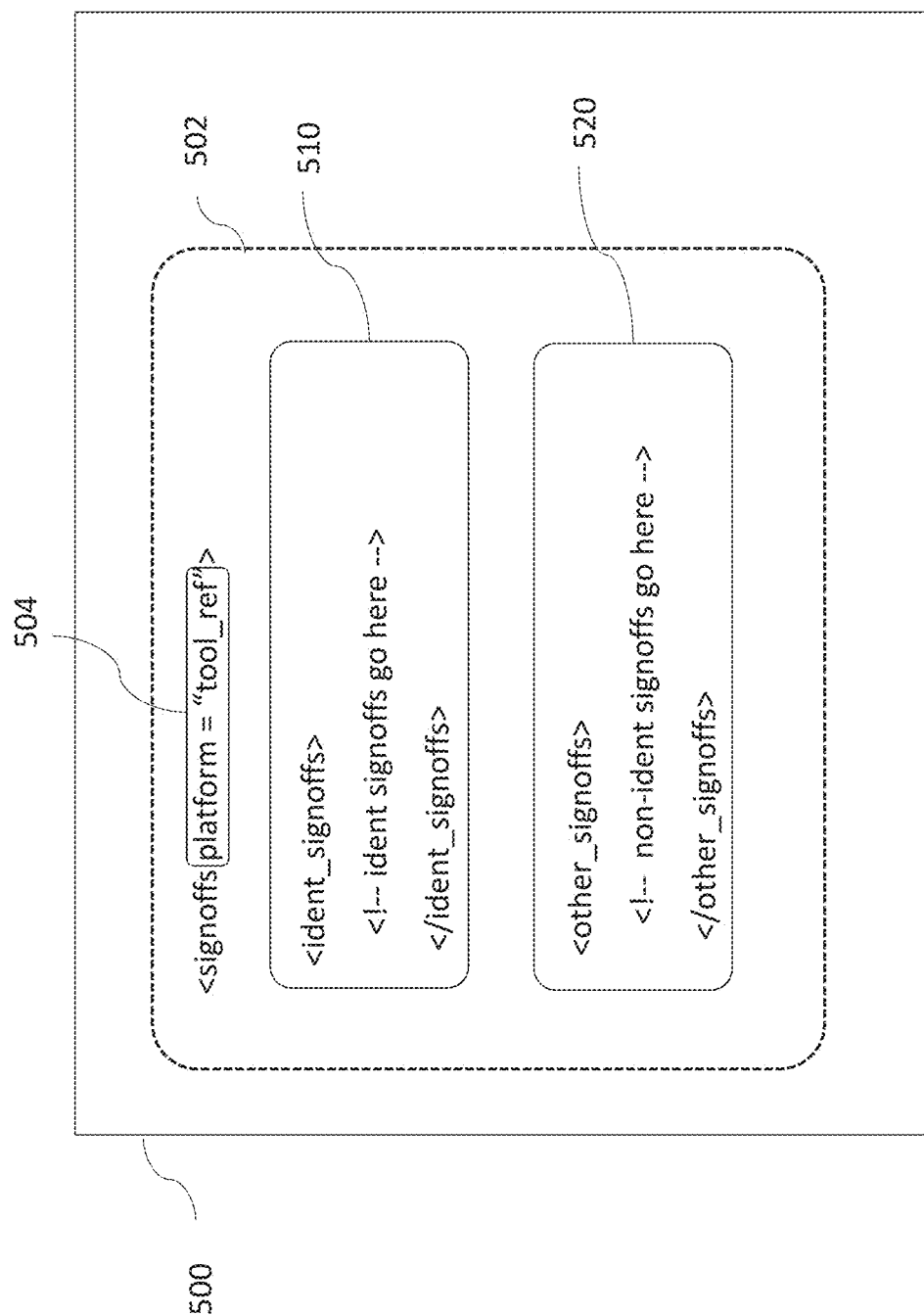
FIG. 5 is an example of a signoff file for a single platform.

Signoffs are defined in a structured data format in a signoff file 500 for each tool. For example, signoffs may be written in XML or another markup language, which uses tags to define elements within the data. FIG. 5 shows an example of the signoff file 500 for a given tool. The signoff file includes a main 'signoffs' element 502 within which all signoffs are defined. This element includes a 'platform' attribute 504 which specifies the tool or platform to which the signoffs in that file apply. In some embodiments, a signoff file 500 has only one platform. A 'signoff schema' attribute may also be defined within the 'signoffs' element 502. Schemas may be specified in markup languages such as XML to specify the structure of the given file or element. In this case, the signoff schema attribute validates the structure of the signoff definitions within the file.

Within the main signoffs element 502, an 'ident signoffs' element 510 may be defined which contains all signoffs that apply to messages with a specific identifier, such as 'SIOB', described earlier. Each ident signoff has an identifier attribute 'ident' 602 corresponding to the messages to be signed off, where a dummy message 400 is only checked for match conditions against ident signoffs with the identifier of the dummy message 400. Ident signoffs are stored in an associative array which can be searched by an ident key. Thus, for checking a given ident message, the operation to find the corresponding signoffs is a direct lookup of the associative array of all ident signoffs for the given ident, i.e. ident_signoffs[ident]. This operation has time complexity of O(1), i.e. it does not depend on the total number of ident signoffs. Once the relevant signoffs have been identified, the operation to match the message to a signoff is limited only to applying regular expressions from the subset of signoffs corresponding to that ident.

The message identifiers in the delivery messages are set by the parser module based on the raw messages output from the verification tools, as described earlier. An 'other signoffs' element 520 may be used for signoffs defined for messages with no message identifiers, so-called 'non-ident' messages (i.e. messages without a populated ident attribute).

The "non-ident" messages may also be sent for comparison with signoffs. Non-ident messages are compared with signoffs in the 'other' sign-offs element 520. That is, the attributes of the non-ident messages other than the non-populated identifier attribute are used to match against match conditions defined in the non-ident signoffs. Thus, it may be possible to match a dummy message 400 without a message identifier with a particular sign-off, based on the values in other attributes of the message. Unlike ident signoffs, non-ident messages are checked against regular expressions for all non-ident signoffs. While they can be needed in certain circumstances, it is preferable that messages signed off have an ident where possible. The parser module 100 may be updated to include regular expressions that are used to sign off messages frequently, using this regular expression as an ident for the corresponding messages such that these messages can be treated by ident signoffs rather than non-ident signoffs.

Figure 6A:
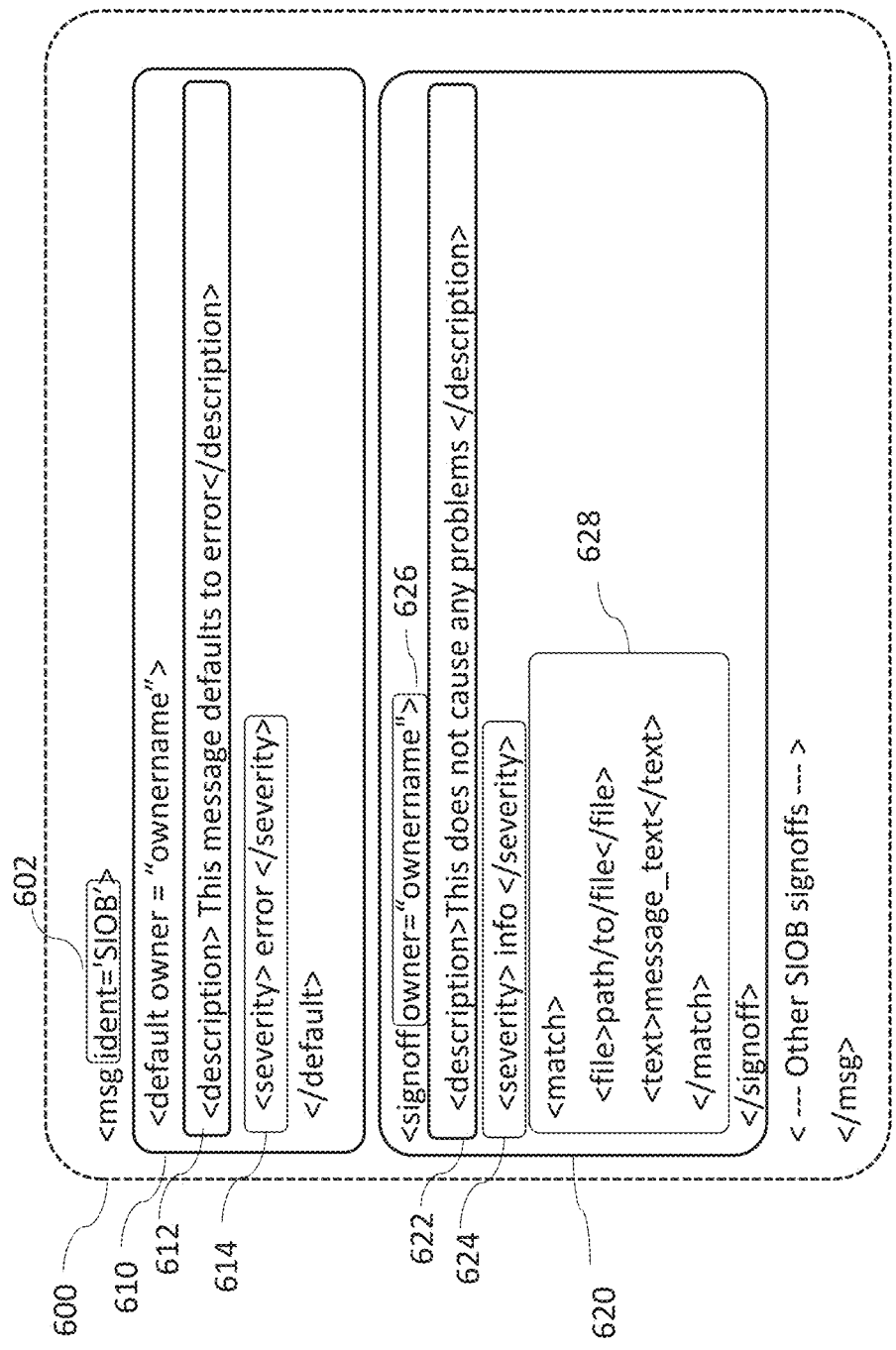
FIG. 6A shows an example of a set of 'ident' signoffs.

FIG. 6A shows an example of a set of 'ident' signoffs within the signoff file 510 for the message identifier 'SIOB'. There may be more than one signoff for each message identifier. All ident signoffs for a single identifier are defined within a 'msg' element 600 which includes the attribute 'ident' 602 defining the messages to which the signoff applies, in this case 'SIOB'. A default element 610 may optionally be defined, which specifies a default severity 614 to be applied to all messages with the given ident, unless a signoff applies. The default element 610 comprises an owner attribute which contains an identifier for the engineer who made the decision to apply the given default severity 614 to the applicable messages. It also comprises a description element 612 which contains a text entry describing the reason for the default rule and a severity element 614 specifying the default severity for the given message identifiers. In this example, the default element specifies a severity of 'error', meaning that all 'SIOB' warnings received by the signoff program will be upgraded to error unless the given message matches another defined signoff.

Non-default signoffs are each defined in a respective signoff element 620, which also comprises an owner attribute 626, which serves to identify the engineer who made the decision of the severity 624 for the signoff, as in the default case. Similarly, the severity element 624 and description element 622 have the same function as in the default case. By defining the owner, severity and description, reports which may be run during testing, identifying signoffs, as described later, are highly informative.

The signoff element 620 comprises an additional 'match' element 628 which defines the attributed of the incoming dummy message 400 that need to be matched to apply the given signoff. This may use any of the attributes defined for messages. Each attribute to be matched is defined within its own element inside the match element 628. For example, the match element 628 may define a file element, to only apply the signoff severity 624 to messages associated to files matching the regular expression defined ('path/to/file'), or a 'text' element which matches on the 'message' or 'text' attribute of the message object (message_text). Regular expressions, i.e. expressions defining a search pattern, are used to match message attributes inside the respective elements. Match elements may also contain arbitrary elements for message attributes that may have been created when a message was parsed.

Multiple attributes may be matched inside a match element 628. Multiple elements defined within a single match element are combined using logical AND. This means that a given dummy message 400 would have to match the regular expressions defined for both 'file' and 'text' for the signoff 620 to apply in the example of FIG. 6A.

Multiple match elements 628 may be combined in the same signoff 620. These are combined using logical OR, such that if a dummy message 400 matches the defined message attributes for any one match element 628 defined within a given signoff, the signoff is applied to that message.

For example, the following signoff may be defined:

```
<signoff gc:owner="ownername">
    <description>...</description>
    <severity>info</severity>
    <match>
        <file>file_name_1.sv</file>
        <text>message_text_1</text>
    </match>
    <match>
        <file>file_name2.sv</file>
        <text>message_text_2</text>
    </match>
</signoff>
```

In this case, the signoff applies, and the severity is set to 'info' for any dummy message 400 that 'hits' either of the matches above, i.e. if the message 400 relates to file 'file_name_1' and the message text contains 'message_text_1' OR it relates to file 'file_name_2' and contains the message text 'message_text_2'.

The description 622 in the specific signoff case may include specific references to the messages that the signoff applies to, where the default description 612 will have a more general statement about the severity of the given message identifier overall. If the signoff is defined to downgrade the severity of a known SIOB message from 'warning' to 'info' as it is known not to cause a problem, the description may include some information explaining why the message should not be a warning in this case. However, the default description 612 for SIOB may explain that in general, messages with this identifier may indicate a real problem and that 'error' is an appropriate severity for all messages except known exceptions covered in the defined signoffs 620.

Multiple individual signoff elements 620 may be defined for the given identifier, each with its own matching criteria. In most cases, it may not be appropriate to provide more than one signoff for any particular message 400.

Figure 6B:
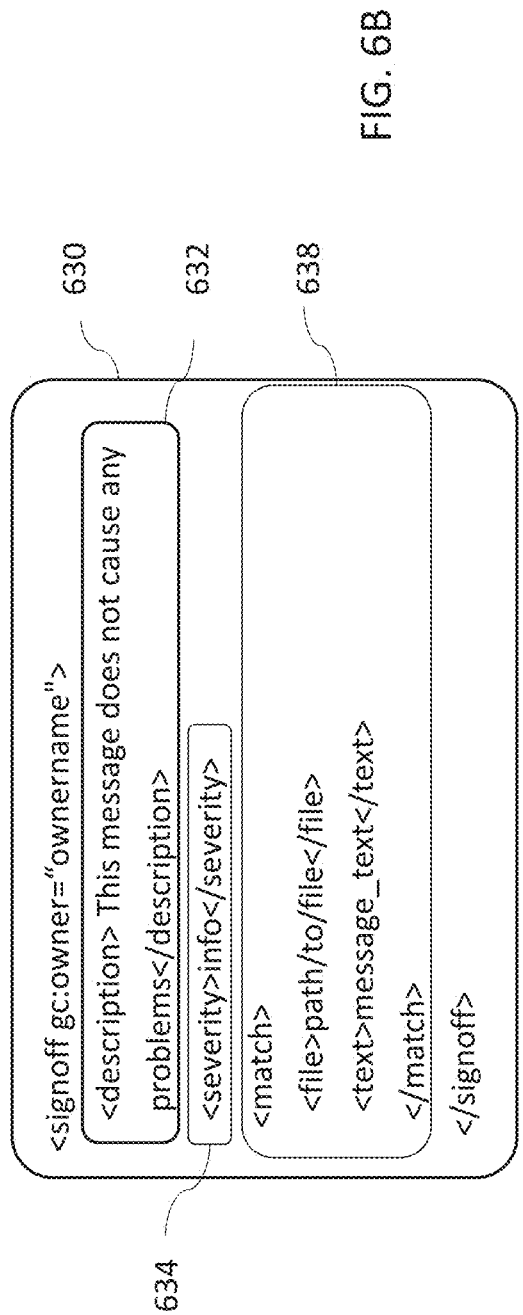
FIG. 6B shows an example of a 'non-ident' signoff.

Non-ident signoffs are defined in the 'other signoffs' element 520 of the signoff file 500 for a given verification platform. FIG. 6B shows the structure of a non-dent signoff. Non-ident signoffs have the same structure as signoffs defined for a given message identifier, as shown in FIG. 6B, with a description element 632, a severity element 634 and a match element 638. The difference between ident and non-ident signoffs is that non-ident signoffs are not defined within a 'msg' element specifying the identifier to which the signoffs apply. Non-ident signoffs are defined directly within the 'other signoffs' element 520 of the signoffs file 500.

Non-ident signoffs 630 are matched by applying regular expressions based on the matching criteria defined in the match element 638. In this case, all dummy messages 400 that do not have a populated identifier attribute are searched for a match to the given signoff. The application of non-ident signoffs 630 may be slower than that of ident signoffs 620, as there is no 'filtering' of messages by identifier attribute before matching.

Note that while in the above examples the signoff is used to change the severity of matching messages, in general signoff rules may be applied to change or define other attributes of the message.

Signoffs may also be nested to combine attributes to be matched. FIG. 6C shows an example of a nested signoff. The outer signoff 620a defines an overall set of matching criteria to apply to incoming dummy messages 400, as well as a description 622 and severity 624 as with ordinary signoffs. However, the outer signoff has an additional inner signoff element 620b defined within it. This signoff element has its own description element 622 and a severity element 624 which may differ from those of the outer signoff. One or more match elements may be defined within the inner signoff element to define criteria on which messages are matched.

The overall effect of the nested signoff is that the rule of the inner signoff 620b is only applied to messages which 'hit' a match element on both the outer signoff 620a and the inner signoff 620b. In the example of FIG. 6C, the outer match element specifies a file name, so that only messages related to that file are checked against the inner signoff 620b. The inner signoff contains two match elements, each of which defines message text on which to match. As noted before, multiple match elements are combined using logical OR. Thus, if a message relates to the given file of the outer signoff and contains the text specified in one of the two inner match elements 628, then the inner signoff is applied, and the message is downgraded to the severity 624 of the inner signoff, in this case 'info'.

Note that a nested signoff achieves the same result as defining a separate signoff for each combination of the outer match element with the inner match elements. So, for example, the nested signoff in FIG. 6C will match the same messages as if two signoffs were defined, the first signoff having a match element containing the file defined for the outer signoff 620a and 'message_text_1' of the first match element 628 of the inner signoff 620b, and the second signoff having a match element containing the file of the outer signoff 620a and text 'message_text_2' of the second match element of the inner signoff. As stated above, message signoffs are configured such that multiple signoffs cannot 'hit' for a single message 400, with the exception of nested signoffs where the inner and outer signoff both 'hit' a single message as described above, although only one signoff rule is applied to matching messages. If two signoffs 'hit' on the same message, it is considered an error, as this is indicative of two conflicting decisions. An engineer may then correct the signoff definitions to correctly handle the given message.

Figure 7:
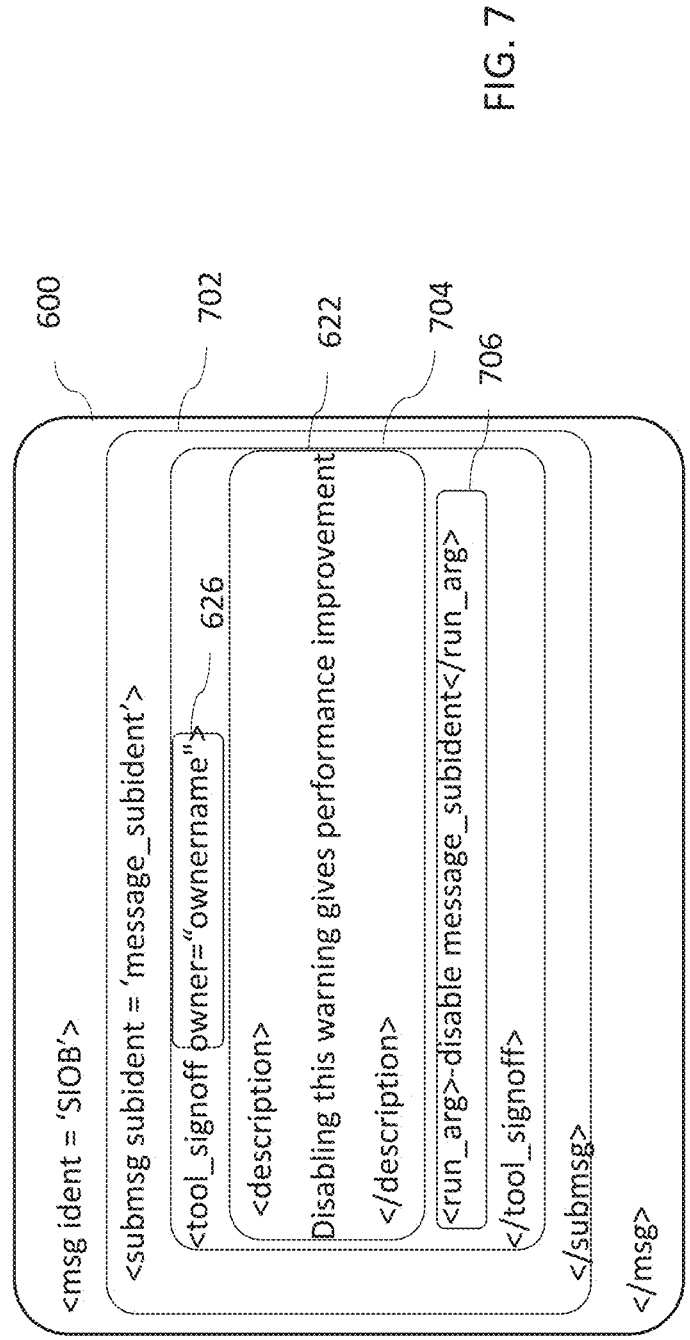
FIG. 7 shows an example of a tool signoff.

A 'tool signoff' may be implemented, which passes an argument back to the verification tool which allows messages matching certain conditions to be disabled at the tool itself. FIG. 7 shows an example of a tool signoff 704. The tool signoff 704 is defined within a 'msg' element 600, along with ident signoffs as described in FIG. 6. A 'submsg' element 702 may be defined within the msg element 600, which contains all the signoffs for a given message 'subident'—i.e. a sub-identifier for the message. The tool signoff 704 is defined in a tool signoff element, which has an owner attribute, again identifying the engineer who made the decision to apply the tool signoff for the given message and tool. The tool signoff 704 contains a description sub-element 622, which explains the reasons for turning off a certain message, as well as a 'run_arg' element 706, which defines the argument that needs to be passed to the tool to be run in order turn off the desired messages. In this example, the 'run_arg' element is 'disable message_subident', which causes the tool to disable all messages with that subidentifier.

Tool signoff may be used if a certain error is preventing the tool from progressing. This may also be useful if a message known to be unimportant is output repeatedly to the extent that removing it would cause a significant performance improvement. However, turning messages off at the testing tool means that no tracking or reporting of those messages can be done as they are no longer received at the output from the tool, and are therefore not parsed or entered into the message database 108.

A report may be generated for a given test or set of tests run, including details of the signoffs for messages generated during those tests. The report is generated to allow engineers to review what messages have been signed off. This report may be generated automatically as part of a test run. This may be displayed in a web browser. The report may comprise multiple tables, including a table of defined signoffs 820, as well as a table of messages signed off during a set of tests run 800. Examples of these tables are shown in FIGS. 8A and 8B.

A separate report may be generated for each test run, as well as a merged report of signoffs that were used across all tests of a given run. A summary page may also be generated with aggregated statistics calculated for the set of tests run, such as the total number of tests run and the total number of signed-off messages.

For each message signed off, a signed-off messages table 800 of the report shows which signoff was responsible for that message and displays both the previous severity 804 and updated severity 806 of that message. FIG. 8A shows an example of a database structure for signed off messages. This includes a signoff field 802, which identifies the particular signoff within a signoff file 500 that was applied to this particular message. The signed off message database also contains 'original severity' 804 and 'severity' 806 fields, which specify the severity of the message before ('original severity') and after ('severity') the signoff was applied. Other fields include standard message database fields, as described above with reference to FIG. 2A, including 'ident' 808, 'subident' 810, 'file' 812, 'line' 814 and 'message' 816 The report may enable a link from the signed-off messages table to the defined signoffs table 820, for example by clicking on the signoff field of a signed-off message in the table. This may open the defined signoffs table at the signoff corresponding to the clicked message. Note that this database is merely an example, and other fields may be defined for signed-off messages.

An example of the database structure for the defined signoffs table is shown in FIG. 8B. The signoff table contains a 'platform' field 822, which specifies the platform in which each signoff is defined, an 'ident' field 824 and a 'subident' field 826 which specify the message identifier (if any) to which each signoff applies, a 'parent' field 828 which references the outer signoff if the given signoff is nested. The owner 830, severity 832, description 836, match 836 and 'run arg' 838 fields contain the values of these elements as defined for the given signoff. The 'source' field 840 identifies the file and location in the file in which that signoff is defined.

The report may be sorted and filtered by any of the fields of the signed-off messages, including the message identifier (such as SIOB) 808, severity 806, etc. This allows efficient review by filtering relevant fields. For example, filtering by the owner of a sign-off allows the review process to be efficiently handled by each engineer reviewing only their own signoffs.

As described above, the signoff process allows an efficient method of reviewing testing tool messages when testing hardware components, and reclassifying messages known not to cause problems while retaining information for later review. Rather than turning off messages of a certain type, this allows all messages to be stored, their original severities saved, and keeps a record of all changes made to messages by signoffs.

Signoffs may be used within a design configurator tool which can take multiple signoff files and merge them.

The invention claimed is:

1. A computer design verification system comprising:
    a parsing module configured to receive output messages from a testing tool arranged to test a computer component and to compose formatted objects from the output messages, each formatted object comprising a set of fields, each field having a field descriptor and at least some of the fields holding test values; and
    a signoff module holding a plurality of signoff objects, each comprising a plurality of fields, each field having a field descriptor and at least some of the fields populated with a signoff expression, each signoff object associated with a severity level indicative of the severity of a condition represented by the signoff object,
    wherein the signoff module is configured to receive the formatted objects from the parsing module and to compare at least one test value in the formatted objects with at least one signoff expression in the signoff objects to determine if a signoff object matches the formatted object, and in the case that it is determined that a signoff object matches the formatted object, associating the severity level of the signoff object with the formatted object.

2. The computer system of claim 1 wherein the signoff object comprises an identity field which identifies the condition represented by the signoff object, wherein the signoff module is configured to compare the identity field with an identity field of the formatted object to determine whether or not there is a match.

3. The computer system of claim 1 wherein one or more of the signoff expressions specify one or more parameter of the signoff condition, and wherein the signoff module is configured to compare the one or more signoff expression with one or more corresponding test values in fields of the formatted object to determine whether the one or more parameter of the signoff condition is matched.

4. The computer system of claim 3 wherein at least some of the signoff objects do not comprise an identifier field.

5. The computer system of claim 1 comprising a signoff configuration file which stores a set of signoff objects associated with at least one of a particular design of computer component to be verified and a particular testing tool.

6. The computer system of claim 2 wherein the signoff module comprises a generic identity indication associated with a default severity level, and wherein the signoff module is configured to apply the default severity level to formatted objects having an identity in their identity field which match the generic identity.

7. The computer system of claim 1 wherein the signoff module comprises a nested signoff storage structure having an outer layer of signoff expressions shared by multiple signoff objects, and an inner layer having signoff expressions of those multiple signoff objects which are not shared.

8. The computer system of claim 5 wherein the signoff module comprises a plurality of signoff configuration files, each signoff configuration file associated with a respective particular testing tool.

9. The computer system of claim 1 wherein the signoff module is configured to receive an identifier of the testing tool and to disable predetermined test outputs from the testing tool.

10. The computer system of claim 1 wherein the parsing module is configured to generate test data objects for storage, each test data object having the format of a corresponding formatted object derived from the test output.

11. The computer system of claim 10 wherein the parsing module is configured to apply the altered severity level received from the signoff module to the test data object prior to storing the test data object in a data structure.

12. The computer system of claim 1 comprising one or more testing tool configured to test the computer component and to generate the test outputs for supply to the parsing module.

13. A method of verifying a computer design, comprising the steps of:
- receiving test outputs from one or more testing tool configured to test a computer component;
- generating from the test outputs a set of formatted objects, each formatted object comprising a set of fields, each field associated with a field descriptor and holding test values;
- supplying the formatted objects to a signoff module holding a plurality of signoff objects, each signoff object comprising a plurality of fields, each field having a field descriptor and holding a signoff expression;
- comparing the test values in the fields of the formatted object with the signoff expressions in the signoff objects to detect if there is a match, and
- in the case of a match associating a severity level of the matched signoff object with the formatted object.

14. The method of claim 13 comprising generating a data storage object from the test outputs, the data storage object having a format corresponding to the format of the formatted object, and storing the test data object in a data structure.

15. The method of claim 14 comprising storing the test data object with the severity level applied by the signoff module.

16. The method of claim 13 in which the formatted object is associated with a severity indicator derived from the test output, the method comprising altering the severity indicator by applying the severity level of the matched signoff object.

17. A computer design verification system comprising:
a parsing module configured to
- receive test outputs from a plurality of testing tools,
- generate from the test data outputs, test data objects, each test data object comprising a plurality of fields, each field having a field descriptor and a test value derived from the test outputs, and
- store the test data objects in a test data structure having a corresponding set of fields, each field having a field descriptor corresponding to the field descriptor of the test data object and configured to receive the test value associated with that field; and
a signoff module holding a plurality of signoff objects, each comprising a plurality of fields, each field having a field descriptor and at least some of the fields populated with a signoff expression, each signoff object associated with a severity level indicative of the severity of a condition represented by the signoff object,
wherein the signoff module is configured to receive the test data objects from the parsing module and to compare at least one test value in the test data objects with at least one signoff expression in the signoff objects to determine if a signoff object matches the test data object, and in the case that it is determined that a signoff object matches the test data object, associating the severity level of the signoff object with the test data object.

18. The computer design verification system of claim 17, wherein the signoff module comprises a nested signoff storage structure having an outer layer of signoff expressions shared by multiple signoff objects, and an inner layer having signoff expressions of those multiple signoff objects which are not shared.

19. The computer design verification system of claim 17, wherein the parsing module is configured to apply the severity level received from the signoff module to the test data object prior to storing the test data object in a data structure.

* * * * *